US009024617B2

(12) United States Patent
Veronesi et al.

(10) Patent No.: US 9,024,617 B2
(45) Date of Patent: May 5, 2015

(54) NON-INTRUSIVE ELECTRICAL LOAD MONITORING

(71) Applicants:William A. Veronesi, Hartford, CT (US); Nicholas Charles Soldner, Southbury, CT (US); Lawrence E. Zeidner, West Hartford, CT (US); Satish Narayanan, Ellington, CT (US)

(72) Inventors: William A. Veronesi, Hartford, CT (US); Nicholas Charles Soldner, Southbury, CT (US); Lawrence E. Zeidner, West Hartford, CT (US); Satish Narayanan, Ellington, CT (US)

(73) Assignee: Carrier Corporation, Farmington, CT (US)

(*) Notice: Subject to any disclaimer, the term of this patent is extended or adjusted under 35 U.S.C. 154(b) by 300 days.

(21) Appl. No.: 13/624,247

(22) Filed: Sep. 21, 2012

(65) Prior Publication Data

US 2013/0076339 A1   Mar. 28, 2013

Related U.S. Application Data

(60) Provisional application No. 61/538,264, filed on Sep. 23, 2011.

(51) Int. Cl.
*G01R 21/00* (2006.01)
*G01R 21/133* (2006.01)
*G01D 4/00* (2006.01)

(52) U.S. Cl.
CPC .............. *G01R 21/00* (2013.01); *G01R 21/133* (2013.01); *G01D 4/002* (2013.01); *Y02B 90/241* (2013.01); *Y04S 20/32* (2013.01); *Y04S 20/38* (2013.01)

(58) Field of Classification Search
CPC .... G01R 21/133; G01R 21/00; G01R 21/005; G01R 19/2513; G01R 22/00; G01R 11/64
See application file for complete search history.

(56) References Cited

U.S. PATENT DOCUMENTS

| 4,858,141 | A  | * | 8/1989  | Hart et al. ..................... 702/61 |
|-----------|----|---|---------|-----------------------------------------|
| 7,069,161 | B2 |   | 6/2006  | Gristina et al.                         |
| 7,089,089 | B2 |   | 8/2006  | Cumming et al.                          |
| 7,412,338 | B2 |   | 8/2008  | Wynans et al.                           |
| 7,668,671 | B1 |   | 2/2010  | Gristina                                |
| 7,804,262 | B2 |   | 9/2010  | Schuster et al.                         |
| 8,664,937 | B2 | * | 3/2014  | Fisera ........................... 324/127 |
| 2003/0135338 | A1 | | 7/2003 | Knaus et al. |
| 2006/0241880 | A1 | | 10/2006 | Forth et al. |
| 2006/0271244 | A1 | | 11/2006 | Cumming et al. |
| 2008/0058997 | A1 | | 3/2008 | Timblin |
| 2009/0009175 | A1 | | 1/2009 | Semati |
| 2010/0305889 | A1 | | 12/2010 | Tomlinson, Jr. et al. |
| 2011/0004421 | A1 | | 1/2011 | Rosewell et al. |
| 2011/0025519 | A1 | | 2/2011 | Donaldson et al. |
| 2011/0066299 | A1 | | 3/2011 | Gray et al. |

FOREIGN PATENT DOCUMENTS

JP     2003284160 A    10/2003

* cited by examiner

*Primary Examiner* — Tung X Nguyen
(74) *Attorney, Agent, or Firm* — Cantor Colburn LLP (57) ABSTRACT

A method of non-intrusive electrical load monitoring of an electrical distribution system includes monitoring a main power line of the electrical distribution system to determine a set of electrical characteristics of the electrical distribution system, receiving a set of state information for a plurality of individual loads of the electrical distribution system, and determining energy consumption characteristics for the plurality of individual loads based upon the set of electrical characteristics and the set of state information.

19 Claims, 6 Drawing Sheets

NON-INTRUSIVE ELECTRICAL LOAD MONITORING

CROSS-REFERENCE TO RELATED APPLICATIONS

This application is a non-provisional patent application which claims the benefit of U.S. provisional patent application 61/538,264 filed Sep. 23, 2011, the entire contents of which are incorporated herein by reference.

BACKGROUND OF THE INVENTION

Figure 1:
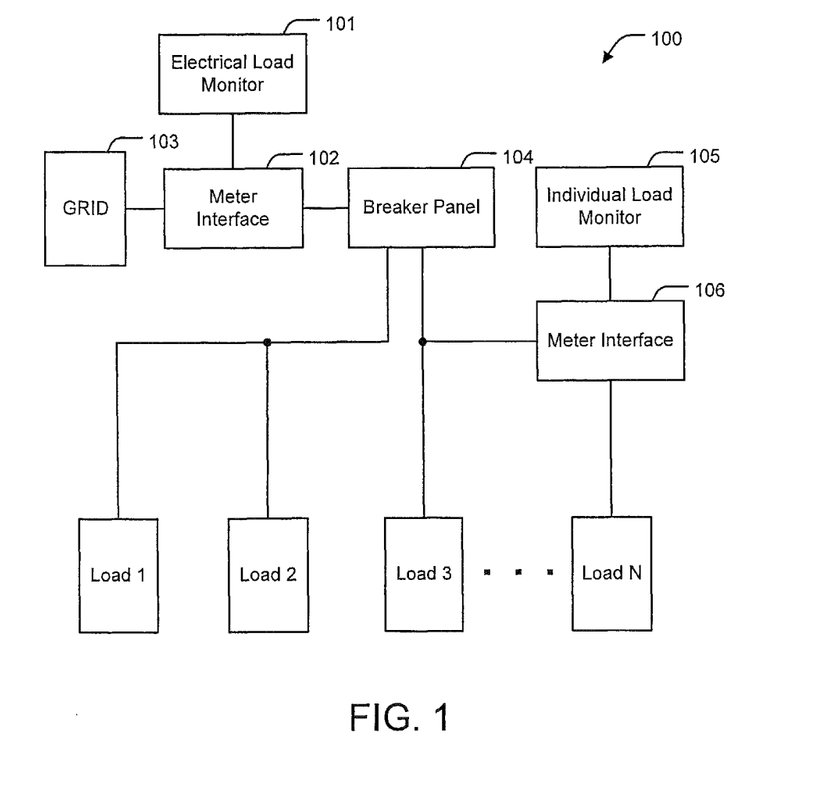
FIG. 1 depicts an electrical system.

Conventionally, an electrical distribution system may include a plurality of different loads which, cumulatively, present a load to an external power grid. It may be desirable to monitor in real-time, or at regular intervals, the amount of load presented. For example, FIG. 1 depicts an electrical distribution system 100. The system includes an electrical load monitor 101. The monitor 101 may monitor a cumulative load through detection of voltage and current at meter interface 102. This cumulative load is presented to electrical power grid 103. The cumulative load is created by electrical loads 1-N, which are fed power through breaker panel 104. It should be appreciated that as loads 1-3 are presented at the single meter interface 102, the monitor 101 can only accurately measure the cumulative load versus any individual contributions from loads 1-3. However, as load N is serviced through meter 106 and individual load monitor 105, the individual contribution from load N may be readily determined. This information may be beneficial as to identifying energy saving or diagnostic opportunities associated with the load N. However, as there are no individual load monitoring devices integrated with loads 1-3, many energy saving opportunities may be lost. Furthermore, given the extra componentry (e.g., 105 and 106) necessary to monitor individual loads, costs associated with load monitoring may be prohibitive and may negate any potential energy savings.

BRIEF DESCRIPTION OF THE INVENTION

According to an exemplary embodiment of the present invention, a method of non-intrusive electrical load monitoring of an electrical distribution system includes monitoring a main power line of the electrical distribution system to determine a set of electrical characteristics of the electrical distribution system, receiving a set of state information for a plurality of individual loads of the electrical distribution system, and determining energy consumption characteristics for the plurality of individual loads based upon the set of electrical characteristics and the set of state information.

According to an additional exemplary embodiment of the present invention, a method of non-intrusive electrical load monitoring of a load arranged within an electrical distribution system includes detecting, at a coil arranged in an area proximate a power line supplying power to the load, electromagnetic flux indicative of a current associated with the load, assembling a carrier waveform to include information about the current, and injecting into the power line, using the coil, the assembled carrier waveform.

According to an additional exemplary embodiment of the present invention, an electrical distribution system includes a main power line, a main electrical load monitor in communication with the main power line, a first electrical circuit branch in communication with the electrical load monitor and the main power line, the first electrical circuit branch distributing electrical power from the main power line to an associated load, and a first individual electrical load monitor proximate the first electrical circuit branch. According to the exemplary embodiment, the first individual electrical load monitor is configured to remotely sense a current flow in the first circuit branch, the first individual electrical load monitor is further configured to assemble a carrier waveform signal including information regarding the current flow in response to the current flow, and the first electrical load monitor is even further configured to inject the assembled carrier waveform into the first electrical circuit branch.

BRIEF DESCRIPTION OF THE DRAWINGS

The subject matter which is regarded as the invention is particularly identified and distinctly claimed in the claims at the conclusion of the specification. The foregoing and other features and advantages of the invention are apparent from the following detailed description taken in conjunction with the accompanying drawings in which:

DETAILED DESCRIPTION OF THE INVENTION

Non-Intrusive Load Monitoring (NILM) is an approach to overcome the limitations of conventional systems which are based on providing separate power monitoring equipment for individual loads. NILM involves the observation of power-use signatures for individual components and inferring the contribution of individual components to future energy use time profiles when many loads may be present. The effectiveness of NILM may be limited in practice by an essential lack of sufficient information to separate out the contributions of similar loads and by the need to carefully commission such a system by operating loads in isolation to gather signature data.

Figure 2:
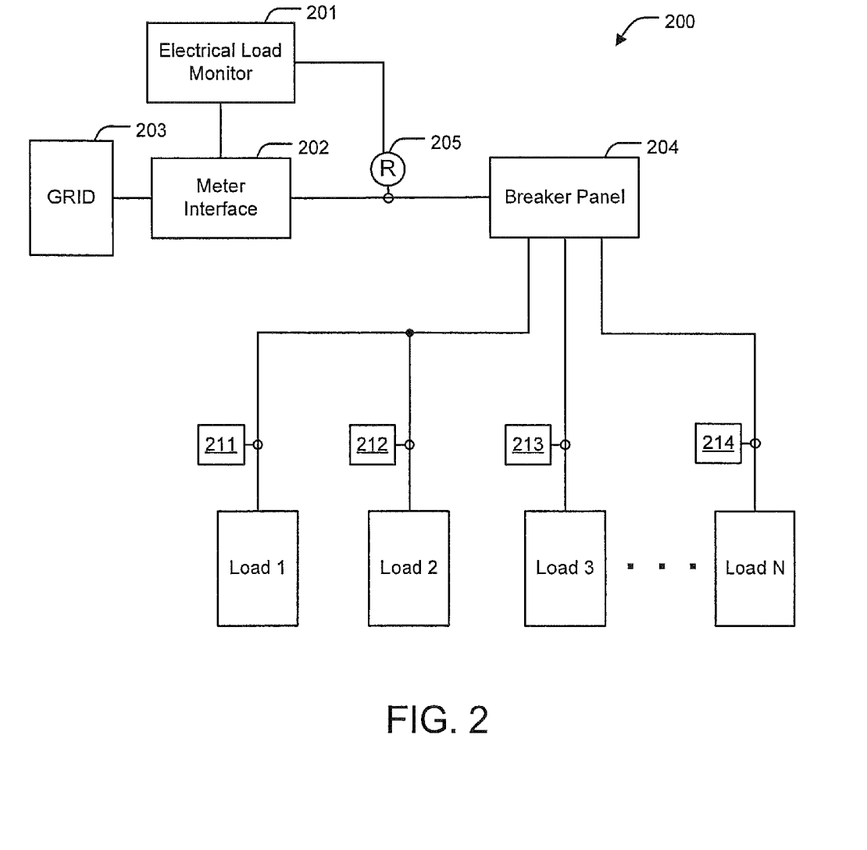
FIG. 2 depicts an electrical system with electrical load monitoring, according to an exemplary embodiment.

Therefore, the practical effectiveness of NILM can be greatly improved by the addition of devices at each load that can indicate a state of each load. The state reported can be on-off or a quantitative measure related to power, current, voltage, etc. For example, FIG. 2 depicts an electrical system with NILM, according to an exemplary embodiment.

The system 200 includes an electrical load monitor 201. The monitor 201 may monitor a cumulative load through detection of voltage and current at meter interface 202. This cumulative load is presented to electrical power grid 203. The cumulative load is created by electrical Loads 1-N, which are fed power through breaker panel 204.

The system 200 further includes load monitoring devices 211-214 arranged proximate an electrical power branch associated with loads 1-N, respectively. For example, monitoring device 211 is proximate an electrical power branch associated with load 1, monitoring device 212 is proximate an electrical power branch associated with load 2, monitoring device 213 is proximate an electrical power branch associated with load 3, and monitoring device 214 is proximate an electrical power branch associated with load N.

Each monitoring device may produce a signal to report back a status of an associated load. The signal is modulated with a carrier signal propagated by means of communication over the power lines between the load monitor 201 and the associated load. For example, the system 200 further includes carrier signal reader or monitor 205. The carrier signal reader or monitor 205 may monitor a main power bus or line within system 200 to determine if the carrier signal exists. The carrier signal may be demodulated to determine each signal representative of each load monitoring device. A device load signal may be arranged as any appropriate representation of the associated load.

Each device 211-214 includes a current sensing means to detect the presence or absence of a load current flowing to its associated load. According to one exemplary embodiment, each device 211-214 may further include a means to determine a quantitative measure of a load current flowing to its associated load. Each device 211-214 may be powered in a plurality of different manners, including but not limited to, internal batteries, external power sources, inductive power from an associated electrical power branch, or any other suitable means. Further, each device 211-214 may not be directly inter-wired within the electrical system 200, but instead may be arranged to detect and transmit electrical load information through induction. Thus, each device 211-214 may be positioned proximate an associated load line, rather than requiring a direct connection and complicated installation, for example, by attaching each device through use of a clip, loop, fastener, adhesive, or any other suitable attachment means.

According to at least one exemplary embodiment, each device 211-214 includes at least one antenna or inductive pickup coil configured to convert flux associated with load current of a respective power branch or a carrier signal into a voltage useable to power the device. Furthermore, in response to receiving said voltage, the device is further configured to modulate an individual address or identification code onto a carrier signal, and inject the carrier signal into the respective power branch through transmission of the modulated signal via the at least one antenna. Therefore, if an associated load is activated (i.e., current begins to flow), the associated device will be powered on by energy associated with the change in flux, modulate a carrier base signal with its identification code, and inject the modulated signal into the associated power line. Upon propagation of the signal to the signal reader or monitor 205, the signal reader or monitor 205 demodulates the carrier signal to extract any enveloped identification codes and provides these codes to the electrical load monitor 201. Therefore, in addition to the cumulative load of the system 200, the electrical load monitor 201 is able to determine the number of active loads in the system 200 and exactly which load(s) are active, (e.g., for load management, security, or other applications).

Therefore, as loads 1-N may be individually monitored through demodulation of a carrier signal propagated through actual power lines, individual contributions from each load may be readily determined through analysis of a cumulative load and identified number of active loads. This information may be beneficial as to identifying energy saving opportunities associated with all of loads 1-N.

However, it may also be beneficial to determine a quantitative measure of a load as well as whether a load is active. Thus, according to some exemplary embodiments, each device 211-214 includes at least one antenna or inductive pickup coil configured to convert flux associated with load current of a respective power branch into a voltage useable to power the device. Furthermore, in response to receiving said voltage, the device is configured to determine a measure of the converted voltage. The actual voltage measurement may be facilitated through an analog to digital converter or other voltage sensing means, and the voltage measured may be indicative of an amount of current, and therefore an amount of a load, associated therewith. Furthermore, the device is further configured to modulate an individual address or identification code as well as the load determination onto a carrier signal, and inject said modulated carrier signal into the respective power branch through transmission of the modulated signal via the at least one antenna or inductive pickup. Therefore, if an associated load is activated (i.e., current begins to flow), the associated device will be powered on by energy associated with the change in flux produced by the load current at the inductive pickup, determine an amount of current or load associated therewith, modulate a carrier base signal with its identification code and the measured load information, and inject the modulated signal into the associated power line. Upon propagation of the signal to the signal reader or monitor 205, the signal reader or monitor 205 demodulates the carrier signal to extract any enveloped identification codes and attached load information, and provides this information to the electrical load monitor 201. Therefore, in addition to the cumulative load of the system 200, the electrical load monitor 201 is able to determine the number of active loads in the system 200, exactly which load is active, and a quantitative measure of a load or current associated with the active loads. For example, this may be useful in a plurality of potential applications including, but not limited to, resource management, load balancing, pricing/usage fees, and other suitable applications.

Therefore, as loads 1-N may be individually monitored through demodulation of a carrier signal propagated through actual power lines, individual contributions from each load may be readily determined by analysis of voltage or current information transmitted by each load monitoring device. This information may be beneficial as to identifying energy saving or diagnostic opportunities associated with the all of loads 1-N.

Figure 3:
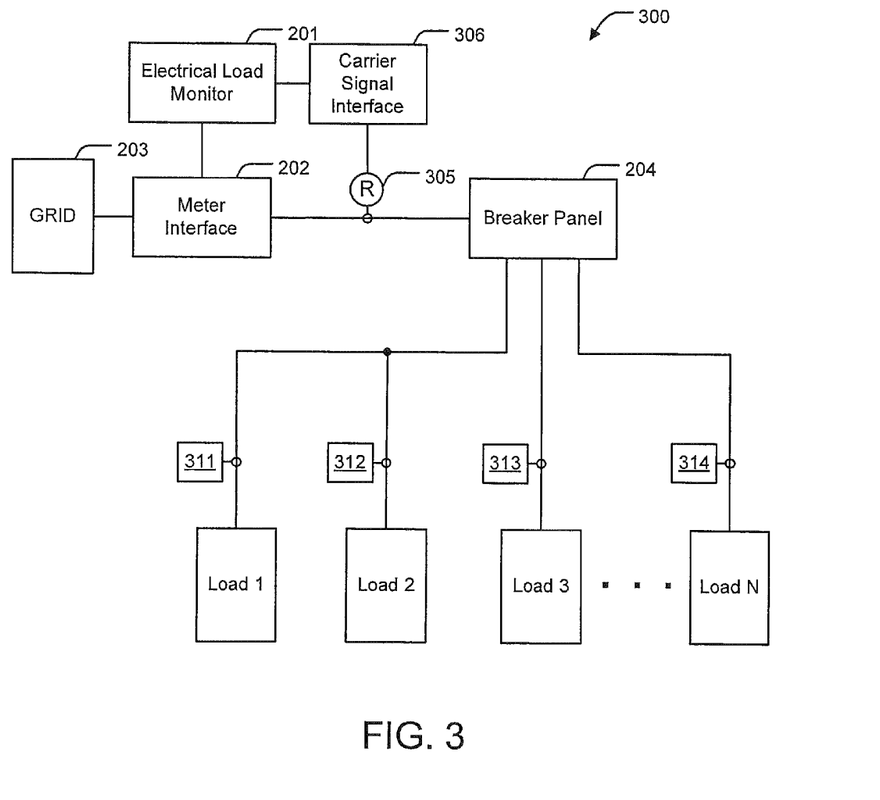
FIG. 3 depicts an electrical system with electrical load monitoring, according to an exemplary embodiment.

As an alternative to the simplified monitoring system illustrated in FIG. 2, FIG. 3 depicts an electrical system with electrical load monitoring including a dedicated carrier signal interface 306, according to an exemplary embodiment. As shown, the dedicated carrier signal interface 306 and carrier signal monitor or detector 305 may provide for increased demodulation and deciphering of information, for example, as would be provided through enhanced individual load monitors 311-314.

The enhanced devices 311-314 may include a variety of current sensing means, voltage detecting means, processing means, and other features in addition to the features described above with regards to devices 211-214. These additional features may provide other information related to an associated load which may also be modulated onto a carrier signal and injected onto an associated power line. Upon signal propagation to the carrier signal monitor 305, the carrier signal interface 306 demodulates and extracts all enveloped information. This detailed information related to each monitored load is provided to the load monitor 201.

Figure 4:
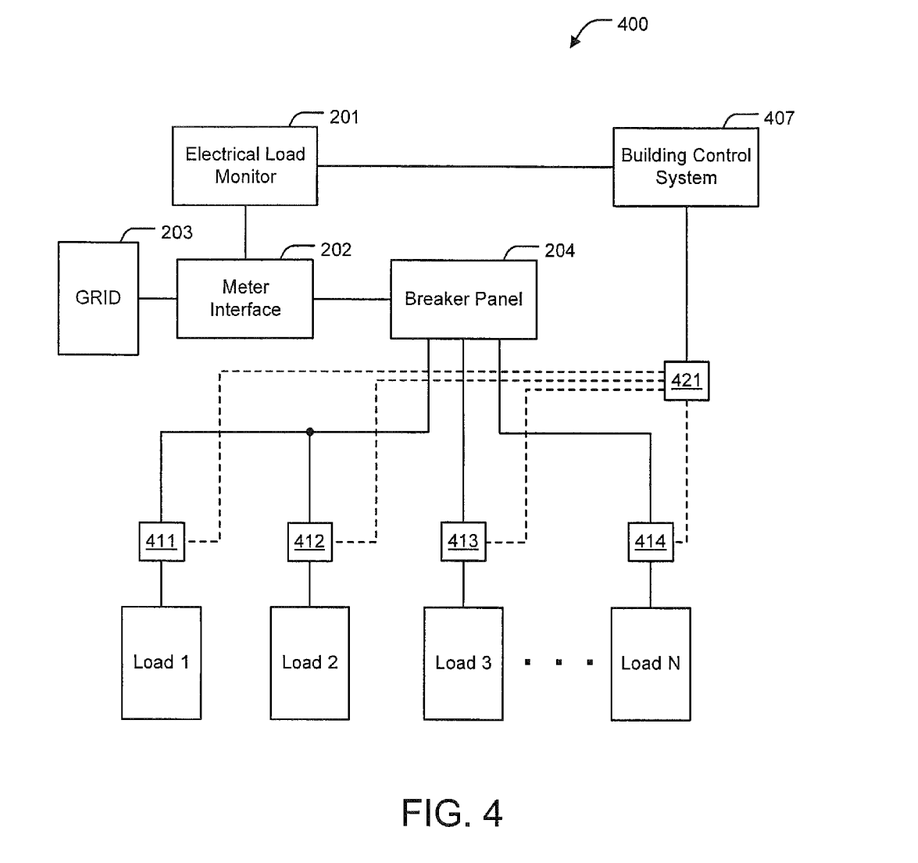
FIG. 4 depicts an electrical system with electrical load monitoring, according to an exemplary embodiment.

In addition to the electrical systems described above, for loads which are controlled by a Building Control System (BCS), the practical effectiveness of a NILM approach can be greatly improved by providing the commanded control state to an electrical load monitor. For example, FIG. 4 depicts an electrical system with electrical load monitoring, according to an exemplary embodiment.

As illustrated, the system 400 includes a BCS 407 configured to control Loads 1-N individually through BCS control elements 411-414. BCS control elements 411-414 are in communication with BCS hub 421, which relays information from BCS 407. Further, the BCS hub 407 provides control state information for each of Loads 1-N to the electrical load monitor 201.

Therefore, as loads 1-N may be individually monitored through receipt of control state information for each load from BCS 407, individual contributions from each load may be readily determined by analysis of a cumulative load and number of active loads as determined from the received control state information. This information may be beneficial as to identifying energy saving or diagnostic opportunities associated with the all of loads 1-N.

Figure 5:
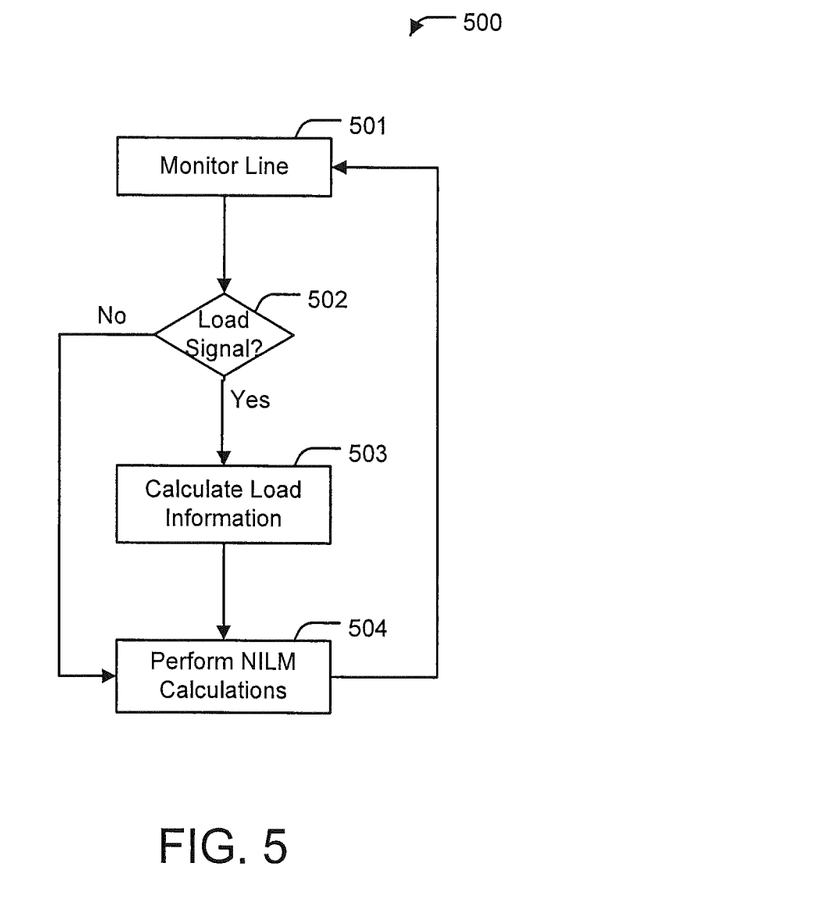
FIG. 5 depicts a flowchart of a method of electrical load monitoring in an electrical system, according to an exemplary embodiment.
Figure 6:
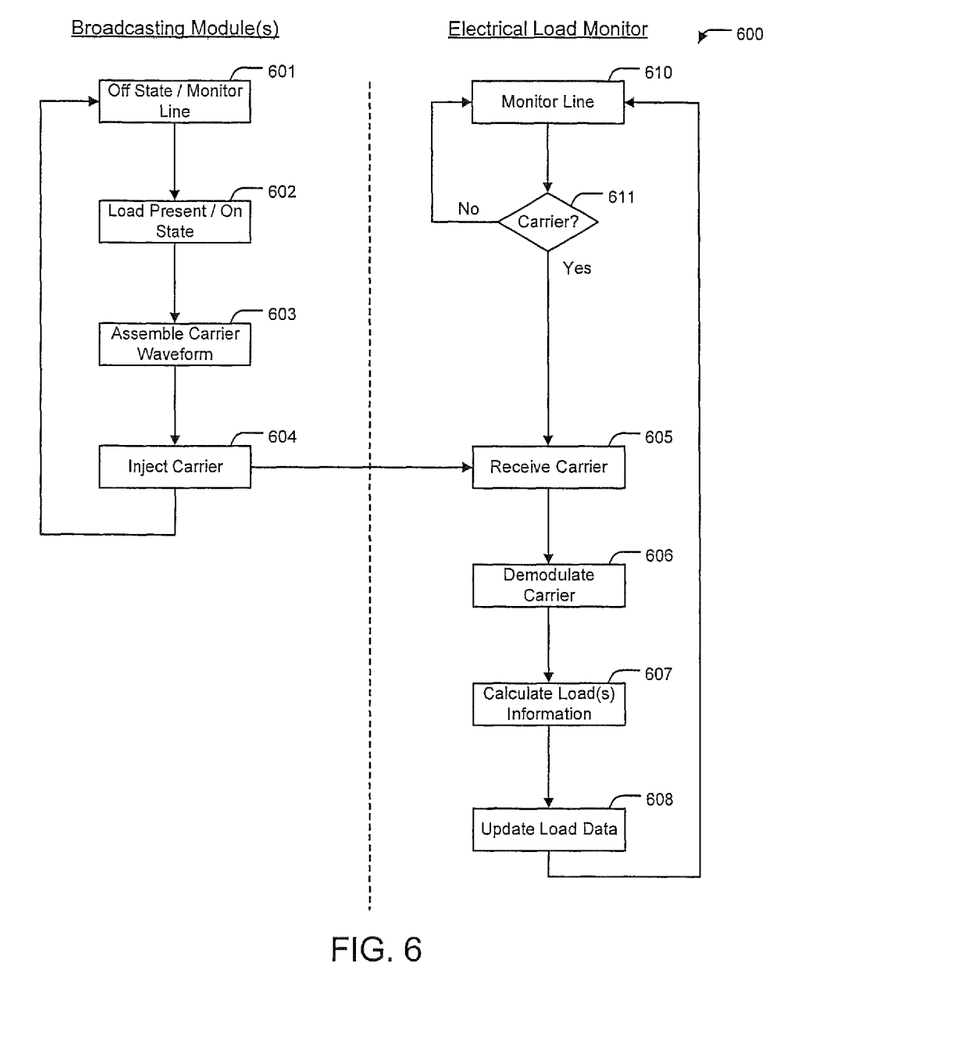
FIG. 6 depicts a flowchart of a method of electrical load monitoring in an electrical system, according to an exemplary embodiment.

Hereinafter, methods of non-intrusive load monitoring associated with the above systems are described in detail. FIGS. 5-6 depict flowcharts of methods of electrical load monitoring in an electrical system, according to exemplary embodiments.

Turning to FIG. 5, the method 500 include monitoring a power line of an electrical system at block 501. The monitoring may be performed by an electrical load monitor, for example, such as load monitor 201. The monitoring may include monitoring an electrical characteristic or characteristics of the electrical system. Such characteristics may include energy usage over time, admittance, conductance, susceptance, and both real and reactive power consumption. Thereafter, the method includes determining if individual load information is available at block 502. If load information is available, the method includes calculating individual load information at block 503. For example, calculating individual load information may include applying knowledge of a particular load's on/off state to a set of variables for a conventional NILM calculation. Thereafter, the NILM calculations are performed at block 504. The NILM calculations may include conventional NILM calculations along with new calculations which separate the electrical characteristics for the loads which are now known to be either off or on based upon the calculations at block 503. However, if no individual load information is available, the method 500 may also perform basic NILM calculations at block 503.

As described above, exemplary embodiments of the present invention include methods of non-intrusive load monitoring which take into consideration the actual on/off state of individual loads in an electrical system instead of reckoning the same through power calculations. For example, the on/off states of individual loads may be provided by a building control system such as building control system 407. By providing an independent signal of load transition, on/off data enables better characterization of load transient signatures, as, for example, instances of single load transitions can be clearly identified and associated with corresponding, observed transient waveforms. On state knowledge simplifies the task of characterizing the typical power requirements of individual loads. With direct control of load state through a building control system, characterization can even be automated and algorithms designed to transition individual loads when steady or no-load conditions exist, simplifying the correct association of transient waveforms and typical load draw with corresponding building loads. A building control system can also be used, over a period of time, to methodically create situations in which particular combinations of devices are on, so that their profiles can be accurately characterized, without confounding interpretation of power level signals from devices that may be poorly characterized beforehand. Hereinafter, a more detailed methodology including control of individual load monitors is described with reference to FIG. 6.

Turning to FIG. 6, the method 600 includes monitoring a power line of an electrical system at block 601. The monitoring may be performed by an individual load monitor, for example, by each of load monitors 211-214 and 311-314. As described above, each individual device may be in a powered-off state if no load current is present, or alternatively, powered by battery or an external power source. Upon detecting that a load is present at block 602, for example, through inductive sensing of flux proximate the power line, the devices assemble a carrier waveform at block 603 and inject the carrier waveform into the power line at block 604. The carrier waveform may be assembled according to the details provided above, such as through modulation of identification information, load on/off information, load or current amplitude information or any other suitable information. The carrier waveform may be based on a relatively constant base signal waveform. Each device continually loops either passively (i.e., in off state due to absence of load) or actively (i.e., if externally powered or battery powered), through blocks 601-604, thereby providing constant monitoring of the electrical system According to the method 600, an electrical load monitor 201 also monitors an electrical system for a carrier signal (e.g., blocks 610-611). For example, the electrical load monitor 601 may monitor a main feed line from a main meter interface 202 to determine if a carrier signal is being propagated thereon. The method 600 includes receiving the carrier signal at block 605. Thereafter, the carrier signal is demodulated at block 606 to extract load information associated with each individual load monitor from the base carrier waveform. The method 600 also includes calculating load information based on the demodulating at block 607, and updating the electrical system's load information or data at block 608. As illustrated, the electrical load monitor 201 continually loops and monitors load information for the electrical system 200.

As described above, exemplary embodiments of the present invention provide novel non-intrusive load monitoring techniques and systems which overcome the drawbacks of conventional, intrusive systems. Exemplary embodiments provide electrical load information useful for uniquely determining the power usage of a number of electrical loads connected to a single power metering system.

Further, exemplary embodiments are applicable to systems including remote control of electrical loads such that commissioning of the monitor system by providing a means to remotely and selectively enable and disable loads is considered in load information calculations. Therefore, the contribution of monitored loads may be studied without the need to access the loads physically.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of non-intrusive electrical load monitoring of an electrical distribution system, comprising:
   monitoring a main power line of the electrical distribution system to determine a set of electrical characteristics of the electrical distribution system;
   receiving a set of state information for a plurality of individual loads of the electrical distribution system;
   determining energy consumption characteristics for the plurality of individual loads based upon the set of electrical characteristics and the set of state information;
   monitoring the main power line of the electrical distribution system for a known carrier waveform;
   receiving the carrier waveform in response to the monitoring; and
   demodulating the carrier waveform to extract the set of state information.

2. The method of claim 1, further comprising:
   calculating individual load information for an associated power grid based on the set of state information.

3. The method of claim 2, further comprising updating electrical load information for each load of the plurality of individual loads based on the calculated individual load information.

4. The method of claim 1, wherein monitoring the main power line includes detecting, at an area proximate the main power line, electromagnetic flux indicative of the carrier signal.

5. The method of claim 4, wherein receiving the carrier waveform includes, receiving, at a coil arranged in the area proximate the main power line, the electromagnetic flux indicative of the carrier signal.

6. The method of claim 5, wherein demodulating the carrier waveform includes extracting a modulated waveform from a base carrier waveform, wherein the modulated waveform includes the electrical load information.

7. The method of claim 6, wherein the carrier waveform is a constant carrier wave associated with an individual load monitoring device proximate a circuit branch supplying a load being monitored.

8. A method of electrical load monitoring of an individual load arranged within an electrical distribution system, comprising:
   detecting, at an inductive coupler arranged in an area proximate a power line supplying power to the individual load, electromagnetic flux indicative of a current associated with the individual load;
   assembling a carrier waveform to include information about the current; and
   injecting into the power line, using the inductive coupler, the assembled carrier waveform.

9. The method of claim 8, further comprising:
   monitoring a main power line of the electrical distribution system for the assembled carrier waveform;
   receiving the assembled carrier waveform in response to the monitoring; and
   demodulating the carrier waveform to extract the information about the current.

10. The method of claim 9, further comprising:
    calculating individual load information for an associated power grid based on the extracted information about the current.

11. An electrical distribution system, comprising:
    a main power line;
    a main electrical load monitor in communication with the main power line;
    a first electrical circuit branch in communication with the electrical load monitor and the main power line, the first electrical circuit branch distributing electrical power from the main power line to an associated load; and
    a first individual electrical load monitor proximate the first electrical circuit branch, wherein the first individual electrical load monitor is configured to remotely sense a current flow in the first circuit branch, wherein the first individual electrical load monitor is configured to assemble a carrier waveform signal including information regarding the current flow in response to the current flow, wherein the first electrical load monitor is configured to inject the assembled carrier waveform into the first electrical circuit branch.

12. The system of claim 11, further comprising a carrier waveform interface proximate the main power line, wherein the carrier waveform interface is configured to extract the assembled carrier waveform from the main power line.

13. The system of claim 12, wherein the carrier wave form interface is configured to demodulate the carrier waveform to extract the information regarding the current flow.

14. The system of claim 13, wherein the main electrical load monitor is configured to update electrical load information for the electrical distribution system responsive to the information regarding the current flow.

15. The system of claim 12, wherein the carrier waveform interface includes an inductive coupler arranged proximate the main power line configured to respond to electromagnetic flux indicative of the carrier signal.

16. The system of claim 11, wherein the first individual electrical load monitor includes an inductive coupler arranged proximate the first circuit branch configured to respond to electromagnetic flux indicative of current flow.

17. The system of claim 11, wherein the inductive coupler of the first individual electrical load monitor is further configured to inject the carrier signal into the first circuit branch.

18. The system of claim 11, further comprising:
    a plurality of electrical circuit branches in communication with the electrical load monitor and the main power line, the each electrical circuit branch distributing electrical power from the main power line to an associated load; and
    a plurality of individual electrical load monitors proximate respective electrical circuit branches, wherein each individual electrical load monitor is configured to remotely sense a current flow in its respective circuit branch, wherein each individual electrical load monitor is configured to assemble a carrier waveform signal including information regarding the current flow in response to the current flow, wherein each individual electrical load monitor is configured to inject the assembled carrier waveform into its respective electrical circuit branch.

19. The system of claim 18, wherein the main electrical load monitor is configured to update electrical load information for the electrical distribution system responsive to information regarding current flow from each of the plurality of individual electrical load monitors.

* * * * *